US 6,577,145 B2

(12) United States Patent
Okuno et al.

(10) Patent No.: US 6,577,145 B2
(45) Date of Patent: Jun. 10, 2003

(54) UNIT WITH INSPECTION PROBE BLOCKS MOUNTED THEREON IN PARALLEL

(75) Inventors: Toshio Okuno, Kanagawa-ken (JP); Masatomo Nagashima, Kanagawa-ken (JP); Atsushi Oguma, Niigata-ken (JP); Tadashi Furumi, Niigata-ken (JP)

(73) Assignees: Soshotech Co., Ltd., Kanagawa-Ken (JP); Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/986,073

(22) Filed: Nov. 7, 2001

(65) Prior Publication Data

US 2002/0053918 A1 May 9, 2002

(30) Foreign Application Priority Data

Nov. 8, 2000 (JP) ........................................ 2000-340128

(51) Int. Cl.[7] .............................................. G01R 31/62
(52) U.S. Cl. ........................ 324/754; 324/446; 324/757
(58) Field of Search ................................. 324/754, 755, 324/158.1, 446, 445, 437, 757, 696, 149; 349/42, 54, 55, 138, 149, 192; 257/72; 702/168; 700/195

(56) References Cited

U.S. PATENT DOCUMENTS 6,310,667 B1 * 10/2001 Nakayoshi ................... 349/42
6,407,795 B1 * 6/2002 Kamizono ................... 349/149

* cited by examiner

Primary Examiner—Kamand Cuneo
Assistant Examiner—Trung Q. Nguyen
(74) Attorney, Agent, or Firm—Wenderoth, Lind & Ponack, L.L.P.

(57) ABSTRACT

A unit has inspection block blocks mounted thereon in parallel, wherein a plurality of inspection probe blocks are inserted into and removed from a guide rail through a slider so that the probe blocks can be loaded or replaced. Each probe block is slidingly moved along the guide rail so that its positional adjustment can be made in an extension length of the guide rail. Only one kind of support base can commonly be used by inserting and removing different probe blocks with respect to the support base and the positional adjustment can be done. The unit with inspection probe blocks mounted thereon in parallel includes a support base and a plurality of inspection probe blocks each having a plurality of blocks and arranged on the support base in parallel. The probes of each inspection probe block are contacted with electrodes of a display panel or wiring circuit board so that inspection can be carried out, wherein a guide rail is disposed on the support base, the inspection probe blocks are slidably fitted to the guide rail through a slider, and each inspection probe block is fixed to the support base at a predetermined slide position.

5 Claims, 6 Drawing Sheets

UNIT WITH INSPECTION PROBE BLOCKS MOUNTED THEREON IN PARALLEL

BACKGROUND OF THE INVENTION

1. Field of the Invention

This invention relates to a unit with inspection probe blocks mounted thereon in parallel, which is used for inspecting a crystal display panel, a plasma display panel, or a wiring circuit board with an IC loaded thereon.

2. Related Art

A device is already known in which a plurality of inspection probe blocks each having a plurality of probes are mounted on a support base in parallel. In this conventional device, the probes of each inspection probe block are contacted with electrodes of the display panel or wiring circuit board and inspection is carried out in that state. Depending on the size of the display panel or wiring circuit board as an object to be inspected, the number of electrodes, arrangement pitches of the electrodes, and the like, the inspection probe block can be replaced with a proper one.

By bolting the inspection probe blocks to the support base, a unit with a plurality of probe blocks mounted thereon in parallel is formed. A bolt hole is formed in each inspection probe block. This bolt hole is designed to have slight play. Within a range of this slight play, each inspection probe block is finely positionally adjusted (fine adjustment of the position of the probe with respect to the electrode). In a case where the size of the display panel or wiring circuit board is different, the inspection probe blocks, which are in conformity with the panal or board, are mounted, in parallel, on a support base having a bolt hole which is in conformity with the inspection probe blocks, thereby forming a unit with inspection probe blocks mounted thereon in parallel. In doing so, the entire unit can be replaced.

However, the above conventional device has the following problems. Since the positional adjustment of each probe block mounted on a specific support base can be done within a range of slight play of the bolt hole, it is difficult to make a sufficient adjustment.

Moreover, much time and complicated work are required for mounting a plurality of inspection probe blocks on a support base in parallel and for replacing an inadequate probe block with an adequate one. In addition, the work for preparing a unit in which inspection probe blocks are mounted on a specific support base in parallel is essentially required. In other words, it is impossible for the conventional device to have a support base that is preliminarily incorporated in an inspection apparatus and only an inspection probe block is replaced in accordance with necessity.

SUMMARY OF THE INVENTION

It is, therefore, a general object of the present invention to provide a unit with inspection probe blocks mounted thereon in parallel which is capable of solving the above-mentioned problems inherent in the conventional device.

In order to achieve the above object, according to the present invention, a guide rail is disposed on a support base and each inspection probe block is slidably fitted to the guide rail through a slider, and the inspection probe block is fixed to the support base at a predetermined slide position.

Each inspection probe block is inserted into and removed from the guide rail through the slider so that the probe block can be loaded or replaced. Each probe block is slidingly moved along the guide rail so that its positional adjustment can be made in an extension length of the guide rail. Only one kind of support base can commonly be used by inserting and removing different probe blocks with respect to the support base and the positional adjustment can be done.

For example, the slider is tightly connected to the guide rail through a bolt, thereby fixing the inspection probe block to the support base. By doing so, the bolt can be tightened at an optional movement position so that the object to be inspected can be replaced.

As one preferred example, the guide rail comprises a guide groove, the slider is slide fitted into the guide groove, the inspection probe blocks are overlapped on a surface of the support base where the guide groove is open, the inspection probe block and the slider are tightly connected together by the tightening bolt through the opening of the guide groove, and a wall for limiting the opening of the guide groove is fixingly sandwichingly held between the slider and the inspection probe block. Owing to this arrangement, by merely tightening the bolt, an optional fixing position can be set, and by merely untightening the bolt, the inspection probe block can be inserted into and removed from the guide rail.

The inspection probe block is overlapped directly on the support base, or overlapped through a pedestal plate on a surface of the support base where the guide groove is open, the inspection probe block is integrally attached to the pedestal plate through the tightening bolt, and the tightening bolt is tightened to tightly connect the pedestal plate and the slider, thereby tightly connecting the inspection probe block and the slider together, so that the fixingly sandwichingly held state is achieved.

As one preferred example, the slider includes a spherical surface, the tightening bolt is threadingly engaged with a top part of the spherical surface, and by tightening the tightening bolt, the spherical surface is abutted with the opening limiting wall at a symmetrical position with respect to an axis of the tightening bolt, so that the fixingly sandwiching held state is achieved.

As the bolt is tightened, the spherical surface is slidingly moved in such a manner as to form the above-mentioned symmetrical position to align the terminal portions at the distal ends of the probes and appropriately prevent the spherical surface from turning on a horizontal plane. This ensures a correct corresponding relation between the probes and the electrodes.

DETAILED DESCRIPTION OF THE INVENTION

Embodiments of the present invention will be described hereinafter with reference to FIGS. 1 to 6.

Figure 1:
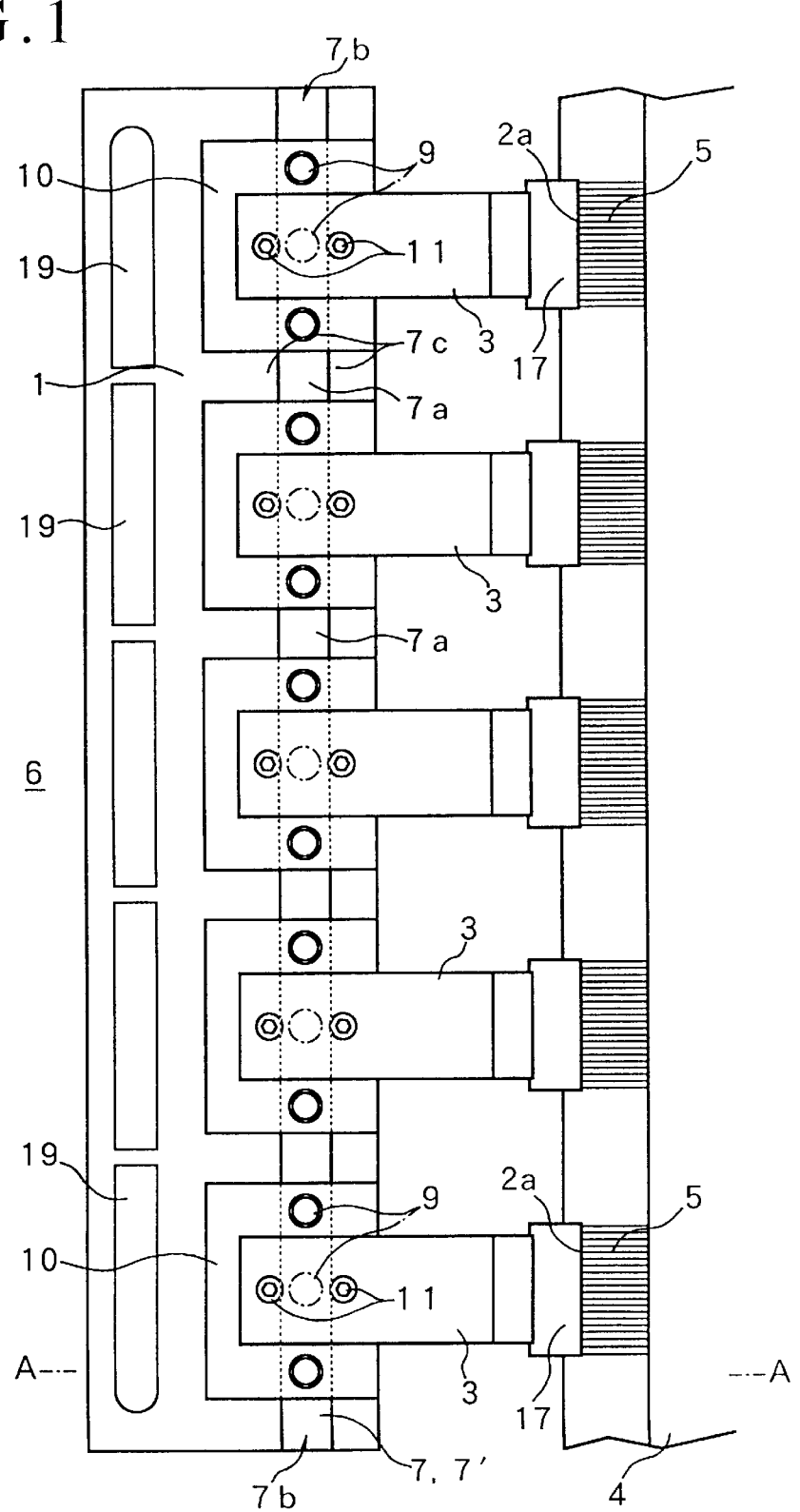
FIG. 1 is a plan view of a unit with inspection probe blocks mounted thereon in parallel.

As shown in FIG. 1, a unit 6 for mounting inspection probe blocks in parallel is formed by mounting a plurality of probe blocks 3 each having a plurality of probes 2 on a support base 1 in parallel. Inspection is carried out by having the probes 2 of each inspection probe block 3 contacted with electrodes 5 of a display panel of a plasma display or the like, or of a wiring circuit board 4 with an IC loaded thereon.

Figure 5:
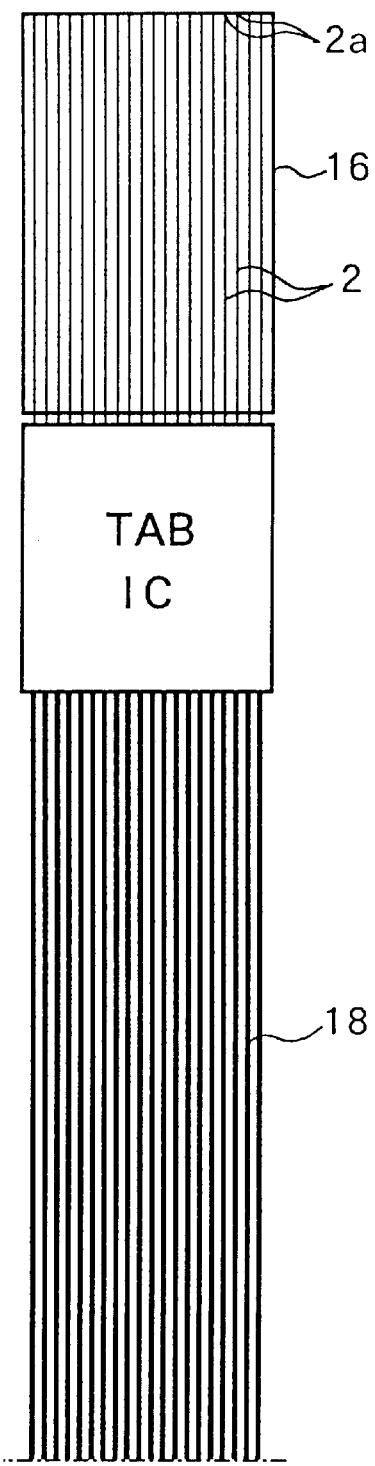
FIG. 5 is a bottom view showing a connecting relation between an insulative film with probes arranged in parallel and a flat wiring cable.

The inspection probe block 3 is known per se. For example, as shown in FIG. 5, the probes 2 are arranged long in parallel on a surface of an insulative film 16. The other surface of the insulative film 16 on the opposite side of the probes 2 is bonded to a backup material 17. Then, the backup material 17 is integrally assembled to a front end of the inspection probe block 3. One end of the probe 2 is protuberated from a front end edge of the backup material 17 to form a contact terminal 2a, and the other end is connected with a flat wiring cable 18 either through or not through an IC. The flat wiring cable 18 is extended along a lower surface of the support base 1 and lead into a cable guide groove 19 formed along a rear end edge of the support base 1, so as to be connected to an inspection apparatus.

The contact terminals 2a are arranged, in parallel, along the front edge of the support base 1, i.e., along the front edges of the inspection probe blocks 3 protuberated from the front end edge of the support base 1, so as to be contacted with the electrodes 5 of the display panel or wiring circuit board 4.

Figure 2:
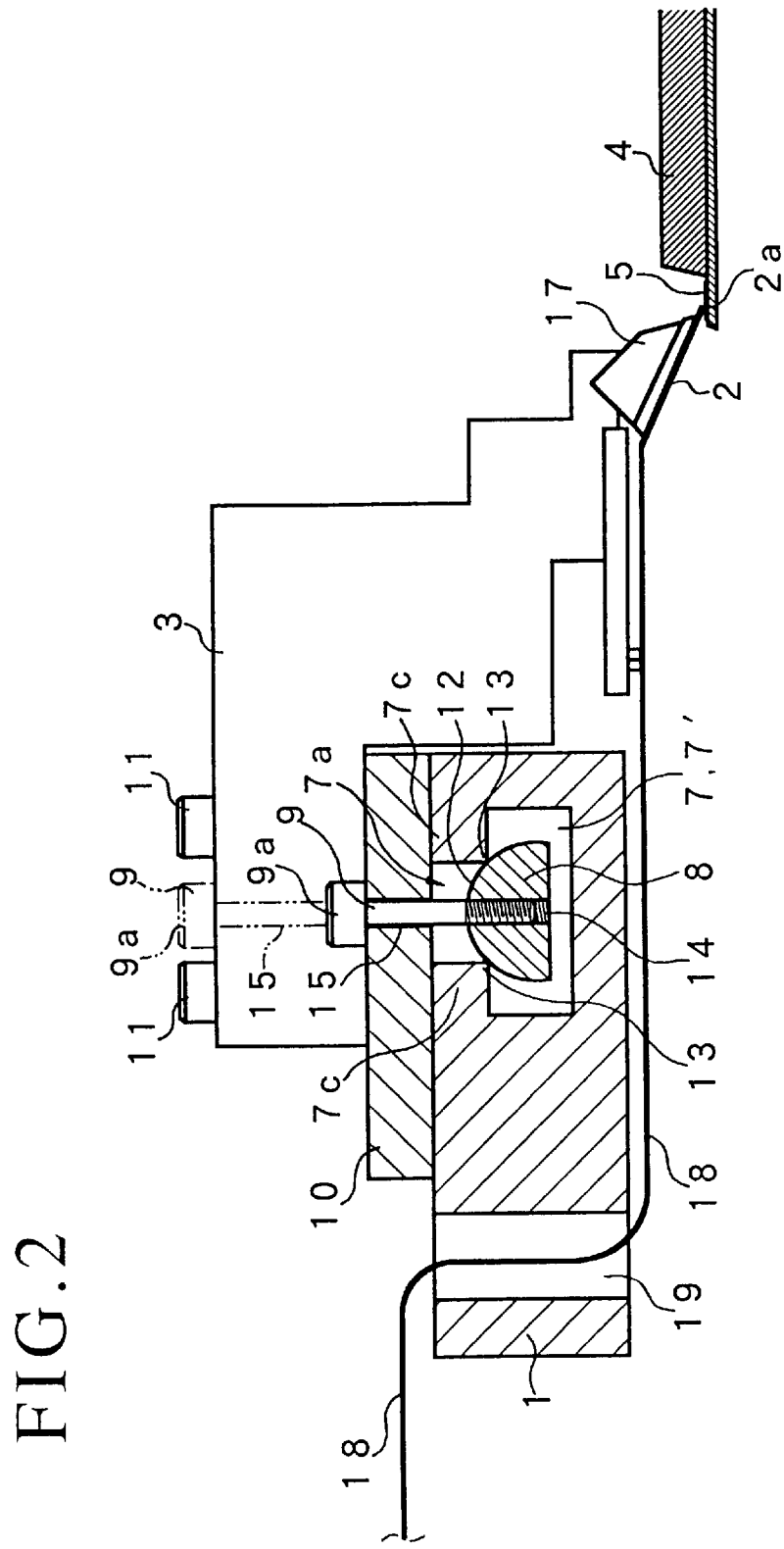
FIG. 2 is a sectional view taken on line A—A of FIG. 1.
Figure 4:
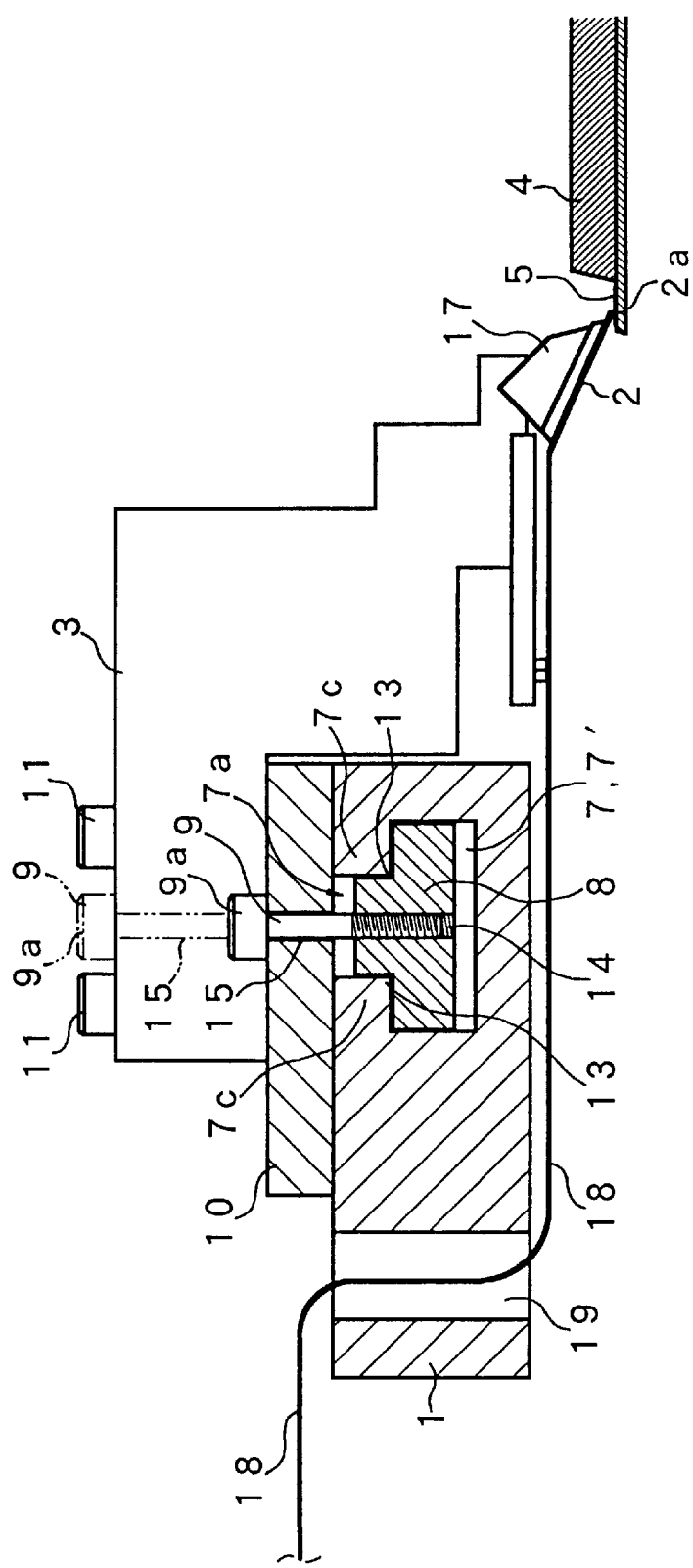
FIG. 4 is a sectional view of a unit with inspection probe blocks mounted thereon in parallel, showing another example of the slider.

As shown in FIGS. 1, 2 and 4, a guide rail 7 is disposed at the support base 1, each inspection probe block 3 is slidably fitted to the guide rail 7 through a slider 8, and the inspection probe block 3 is fixed to the support base 1 at a predetermined slide position.

Each inspection probe block 3 is inserted into and removed from the guide rail 7 through the slider 8 so that the probe block 3 can be loaded or replaced. Each probe block 3 is slidingly moved along the guide rail 7 so that its positional adjustment can be made in an extension length of the guide rail 7.

Thus, different probe blocks are inserted into and removed from the support base 1 to commonly use the support base 1 and the above-mentioned positional adjustment is carried out.

For example, the slider 8 is tightly connected to the guide rail 7 through a bolt 9, thereby fixing the inspection probe block 3 to the support base 1. By doing so, the bolt 9 can be tightened at an optional movement position so that the object to be inspected can be replaced.

As one preferred example, the guide rail 7 comprises a guide groove 7'. The guide groove 7' extends from one end of the support base 1 to the other end and is open 7a at the surface of the support base 1 over its entire length. Opposite ends of the guide groove 7' are also open (i.e., open ends) 7b. The guide groove 7' is a wide width groove and its opening 7a is a narrow width groove.

The slider 8 is slide fitted into the guide groove 7' through the open end 7b, the inspection probe blocks 3 are overlapped on the surface of the support base 1 where the guide groove 7' is open, the inspection probe block 3 and the slider 8 are tightly connected together by the tightening bolt 9 through the opening 7a of the guide groove 7', and a wall 7c for limiting the opening of the guide groove 7' is fixingly (fixedly) sandwichingly held between the slider 8 and the inspection probe block 3.

Owing to this arrangement, a tightly connected state of the slider 8 with respect to the guide rail 7 is obtained by tightening the bolt 9, thereby optionally setting the fixing position, and a released state of the slider 8 with respect to the guide rail 7 is obtained by untightening the bolt 9, thereby enabling the inspection probe block 3 to be inserted into and removed from the guide rail 7 (guide groove 7' in the illustrated example).

The inspection probe block 3 is overlapped directly on the support base 1, or overlapped through a pedestal plate 10, as shown in FIGS. 1, 2 and 4, on a surface of the support base 1 where the guide groove 7' is open, the inspection probe block 3 is then integrally attached to the pedestal plate 10 through a tightening bolt 11 and the tightening bolt 11 is tightened to tightly connect the pedestal plate 3 and the slider 8, thereby tightly connecting the inspection probe block 3 and the slider 8 together, so that the above-mentioned fixingly sandwichingly held state is achieved.

Figure 3:
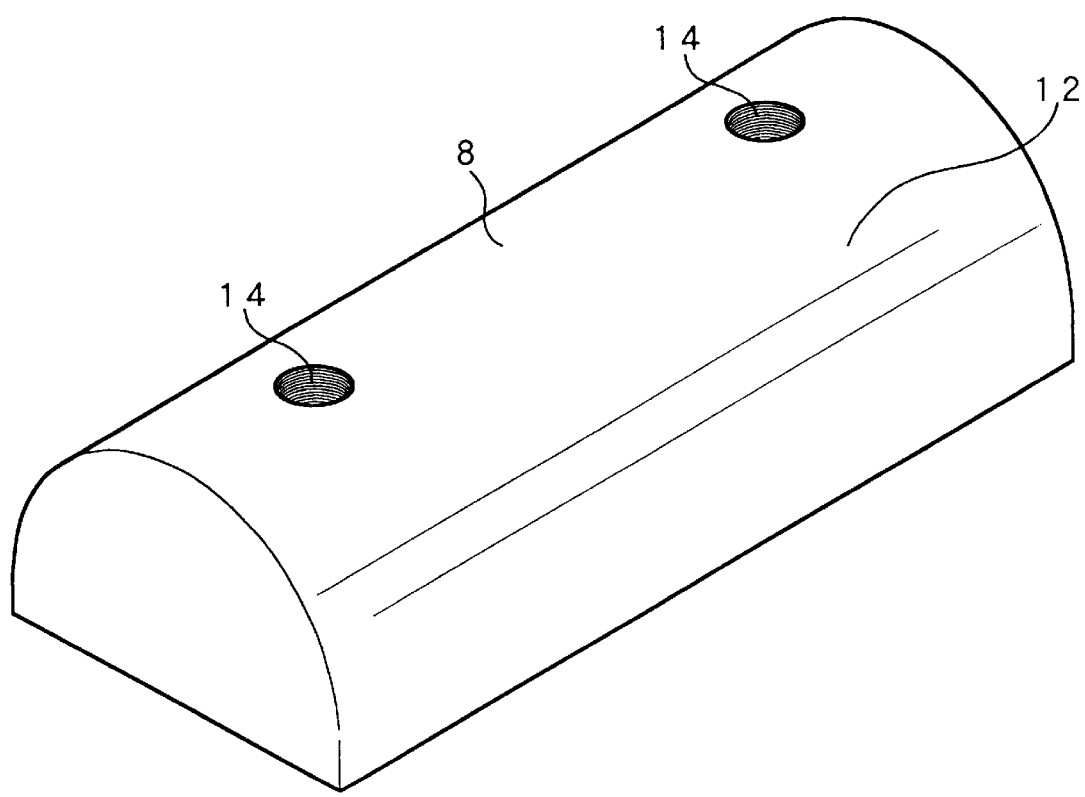
FIG. 3 is a perspective view of a slider.

As one preferred example, a semi-cylindrical slider 8 including a spherical surface, as shown in FIGS. 2 and 3, is employed. The semi-cylindrical slider 8 is disposed such that a spherical surface 12 is placed opposite the opening 7a. The tightening bolt 9 is threadingly engaged with a top part of the spherical surface 12, and by tightening the tightening bolt 9, the spherical surface 12 is abutted with an inside angular edge 13 of the opening limiting wall 7c on a generating line which is located in a symmetrical position with respect to an axis of the tightening bolt 9, so that the above-mentioned fixingly sandwiching held state is achieved.

When the bolt 9 is turned in one direction, the slider 8 threadingly engaged therewith is slightly ascended. Then, by tightening the bolt 9, the spherical surface 12 is abutted with the inside angular edge 13 and slidingly moved in such a manner to form the symmetrical position, thereby aligning the contact element 2a of the distal end of the probe 2 on a same line and appropriately preventing the spherical surface 12 from turning on a horizontal plane. This ensures a correct corresponding relation between the probes 2 and the electrodes 5.

In contrast, when the tightening bolt 9 is turned in the other direction, the slider 8 threadingly engaged therewith is slightly descended and brought away from the inside angular edge 13. That is to say, the tightly connected relation is released. As a result, the probe block 3 can freely be removed or its position adjusted by being freely moved along the guide rail 7 together with the slider 8.

The tightening bolt 9 is loosely inserted into the attachment hole 15 formed in the pedestal plate 10, or loosely inserted into the attachment hole 15 formed in the inspection probe block 3 as indicated by a broken line of FIGS. 2 and 4. One axial end of the tightening bolt 9 is threadingly engaged with a female screw hole 14 formed in the top part of the spherical surface through the opening 7a, and its bolt head 9a is rested on the pedestal plate 10 or rested on the surface of the inspection probe bock 3 as indicated by the broken line of FIGS. 1, 2 and 4, so that the inspection probe block 3 and the slider 8 are tightly connected together and the opening limiting wall 7c is sandwichingly held between the inspection probe block 3 and the slider 8, thereby fixing the inspection probe block 3 to the support base 1.

It should be noted that the present invention includes a case wherein a plurality of the female screw holes 14 are arranged on the generating line at the top part of the spherical surface 12 in parallel. The female screw holes 14 are formed from the top part of the slider 8 all the way to the bottom surface.

FIG. 4 shows another example of the slider 8. This slider 8 is formed of a square block. One pair of opposing side surfaces of the square block are disposed in abutted relation or proximate relation to one pair of opposing inner surfaces of the guide groove 7' in order to restrict the rotation. The slider 8 ensures a linear movement along the guide groove 7' and prevents the turning motion. As in the above-mentioned example, the tightening bolt 9 is loosely inserted into the attachment hole 15 formed in the pedestal plate 10 or loosely inserted into the attachment hole 15 formed in the inspection probe block 3 as indicated by the broken line of FIG. 4. The axial end of the tightening bolt 9 is threadingly engaged with the female screw hole 14 provided on a center line of the upper surface of the probe block through the opening 7a, and its bolt head 9a is rested on the pedestal plate 10 or rested on the surface of the inspection probe bock 3 as indicated by the broken line of FIG. 4, so that the inspection probe block 3 and the slider 8 are tightly connected together and the opening limiting wall 7c is sandwichingly held between the inspection probe block 3 and the slider 8, thereby fixing the inspection probe block 3 to the support base 1.

In any of the above-mentioned examples shown in FIGS. 2 and 4, there is disclosed a unit with inspection probe blocks mounted thereon in parallel, in which the guide rail 7 is disposed at the support base 1, the inspection probe bock 3 is slidably fitted to the guide rail 7 through the slider 8, and the inspection probe block 3 is fixed to the support base 1 at a predetermined slide position.

It is also accepted that the guide rail 7 comprises a ridge, for example, a dovetail ridge, instead of the guide groove 7' of FIGS. 2 and 4, which ridge extends from one end of the support base 1 to the other end along the surface of the support base 1, and the slider 8 is slidingly fitted to the ridge and tightly connected together through the tightening bolt 9.

Figure 6:
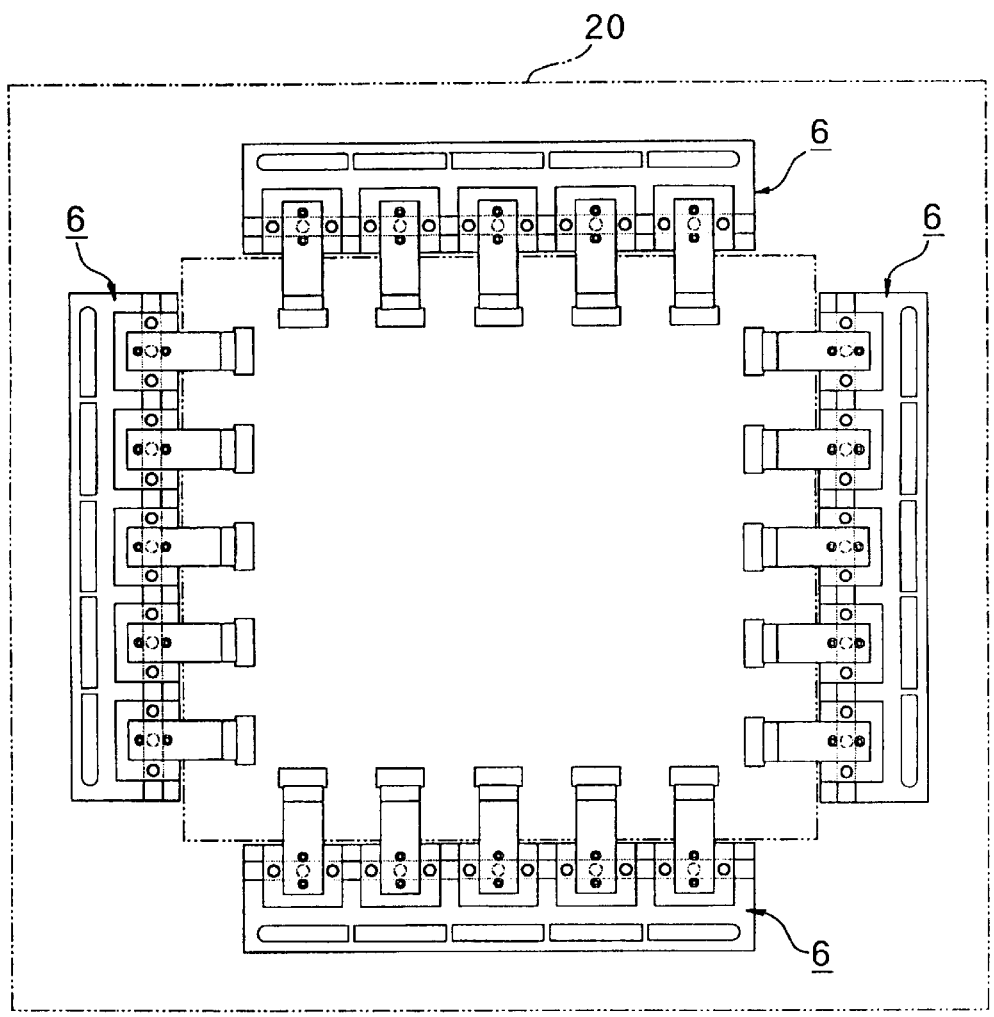
FIG. 6 is a plan view showing an example in which units with inspection probe blocks mounted thereon in parallel are loaded on a frame-like main plate.

As shown in FIG. 6, the unit 6 with the inspection probe blocks 3 mounted thereon in parallel is attached to one to four sides of a frame-like main base plate 20 by screw means or the like. That is to say, the support base 1 of the unit 6 as a sub-plate is removably attached to the one to four sides of the main base plate 20, and the contact terminals 2a of each unit 6 are arranged in parallel along the inner side of the frame side, such that the contact terminals 2a can be press contacted with the electrodes 5 of the display panel or wiring circuit board 4 (see FIGS. 2 and 4) disposed at the inside of a window.

The main base plate 20 with the unit 6 loaded thereon is supported such that it can move towards and away from the display panel or the like. When the main base plate 20 is moved towards the display panel or the like, the above-mentioned press-contact relation can be obtained.

As apparent from the description made hereinbefore, each inspection probe block is inserted into and removed from the guide rail through the slider, thereby enabling the carrying out of replacement and mounting. The positional adjustment can be made by slidingly moving the inspection probe block in the extension length of the guide rail. Also, by inserting and removing different inspection probe blocks with respect to only one kind of support base, the above-mentioned positional adjustment can be made.

Moreover, merely by moving the inspection probe block on the guide rail and tightening the tightening bolt, the attachment operation can easily be made while setting the fixed position. And merely by untightening the bolt, the inspection probe block can be inserted into and removed from the guide rail.

The spherical surface of the slider is slidingly moved in such a manner as to form the above-mentioned symmetrical position by tightening the bolt, so that the contact terminals at the distal ends of the probes are all aligned. In addition, the turning of the spherical surface of the slider on a horizontal plane can be properly prevented. Thus, a correct corresponding relation can surely be obtained between the contact terminals and the electrodes.

What is claimed is:

1. A unit comprising:

a support base having a guide rail disposed thereon, said guide rail comprising a guide groove having a wall with an opening therein; and a plurality of inspection probe blocks arranged on said support base in parallel, each of said plurality of inspection probe blocks having a plurality of probes, said probes of each of said inspection probe blocks being adapted to contact with electrodes of a display panel or a wiring circuit board so that inspection of the display panel or the wiring circuit can be carried out;

a plurality of sliders associated with said plurality of inspection probe blocks, respectively, and a plurality of tightening bolts; wherein said inspection probe blocks are slidably fitted to said guide rail with said sliders, and each of said inspection probe blocks is adapted to be fixed to said support base at a predetermined slide position, said sliders are slidably fitted into said guide groove, said inspection probe blocks are overlapped on a surface of said support base where said guide groove is open, said inspection probe blocks and said sliders are tightly connected together by said tightening bolts through the opening of said guide groove, and said wall of said guide groove having the opening is fixedly held between said sliders and said inspection probe blocks in a fixedly held state.

2. A unit according to claim 1, wherein said tightening bolts tightly connect said sliders to said guide rail, thereby fixing said inspection probe blocks to said support base.

3. A unit according to claim 1, further comprising a plurality of pedestal plates, wherein each of said inspection probe blocks is overlapped on the surface of said support base, where said guide groove is open, through one of said pedestal plates, said inspection probe blocks are integrally attached to said pedestal plates through said tightening bolts, and said tightening bolts are adapted to tightly connect said pedestal plates and said sliders, thereby tightly connecting said inspection probe blocks and said sliders together, respectively, so that the fixedly held state is achieved.

4. A unit according to claim 1, wherein said sliders each have a spherical surface, said tightening bolts are threadingly engaged with a top part of said spherical surfaces, and by tightening said tightening bolts, said spherical surfaces are abutted with said wall at a symmetrical position with respect to axes of said tightening bolts, so that the fixedly held state is achieved.

5. A unit according to claim 3, wherein said sliders each have a spherical spherical surface, said tightening bolts are threadingly engaged with a top part of said spherical surfaces, and by tightening said tightening bolts, said spherical surfaces are abutted with said wall at a symmetrical position with respect to axes of said tightening bolts, so that the fixedly held state is achieved.

* * * * *